United States Patent
Choi

(10) Patent No.: US 6,468,899 B1
(45) Date of Patent: Oct. 22, 2002

(54) CONTACTLESS LOCAL INTERCONNECT PROCESS UTILIZING SELF-ALIGNED SILICIDE

(75) Inventor: Seungmoo Choi, Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/893,078

(22) Filed: Jun. 27, 2001

(51) Int. Cl.⁷ .......................................... H01L 21/4763
(52) U.S. Cl. ...................................... 438/651; 257/384
(58) Field of Search ................................ 438/654, 655, 438/656, 647, 648, 649, 651; 257/384

(56) References Cited

U.S. PATENT DOCUMENTS

| | | | | |
|---|---|---|---|---|
| 5,190,893 A | * | 3/1993 | Jones, Jr. et al. | 437/192 |
| 6,027,964 A | * | 2/2000 | Gardner et al. | 438/238 |
| 6,150,266 A | * | 11/2000 | Lin et al. | 438/682 |
| 6,207,543 B1 | * | 3/2001 | Harvey et al. | 438/586 |

* cited by examiner

Primary Examiner—David Nelms
Assistant Examiner—Quoc Hoang
(74) Attorney, Agent, or Firm—Christie, Parker & Hale, LLP

(57) ABSTRACT

A contactless, self-aligned local interconnect structure provides a continuous silicide film electrically coupling an upper silicon structure to a lower silicon structure. The upper silicon structure overlaps the lower silicon structure and is insulated from the lower silicon structure by an insulating layer formed between the structures. The continuous silicide film electrically couples the two structures by bridging the gap formed by the insulating layer in the overlap region. The associated process for forming the local interconnect structure includes forming a lateral edge of the upper silicon structure extending over the lower silicon structure, forming a blanket metal film, then heating the metal film such that the metal film reacts with the exposed silicon of the upper silicon structure and the lower silicon structure to form a continuous silicide film which bridges the gap formed by the insulating layer which is formed of a thickness chosen to be suitably low. After the silicide film is formed, unreacted portions of the metal film are removed.

21 Claims, 2 Drawing Sheets

CONTACTLESS LOCAL INTERCONNECT PROCESS UTILIZING SELF-ALIGNED SILICIDE

FIELD OF THE INVENTION

The present invention relates generally to semiconductor integrated circuit devices. More particularly, the present invention relates to a contactless local interconnect structure and the process for forming the same.

BACKGROUND OF THE INVENTION

Local interconnect structures provide electrical and physical connection between semiconductor device features formed in close proximity to one another. The ever-increasing integration levels of semiconductor integrated circuit devices and the associated drive to reduce the sizes of individual components and cells renders local interconnect structures particularly useful in today's advancing semiconductor manufacturing industry.

Conventional local interconnects are formed by forming contact windows in insulating materials formed over the features desired to be electrically connected. After the insulating material is formed over the structures, a contact window or windows are formed exposing portions of each of the features to be electrically connected to one another. One contact window may be formed exposing portions of each of the features to be electrically connected or dedicated contact windows may be separately formed to expose each feature. In some cases, stacked contact windows may be required to be formed in each of successively deposited insulating materials. In either case, a very precise alignment process must be carried out to insure that the contact windows are properly positioned. This is especially critical when feature sizes are reduced requiring a corresponding reduction in local interconnect feature sizes. In either case, after the contact window or windows are formed, a conductive material is formed within the contact window or windows in order to provide connection. Typically, after the conductive material is formed within the opening or openings, a planarization process such as chemical mechanical polishing (CMP) must be carried out to remove superfluous portions of the conductive material formed.

The process for forming and especially aligning the contact structure or structures is a time-consuming and costly process and is inherently risky because a tight alignment tolerance is required. Marginally aligned or misaligned contact windows commonly occur and can result in device failure. To address the limitations of conventional processing techniques, what is needed is a local interconnect structure and a process for producing the structure that reliably interconnects device features without the risks and processing difficulties associated with forming precisely aligned contacts.

SUMMARY OF THE INVENTION

To meet these and other needs, and in view of its purposes, the present invention provides a contactless local interconnect and a process for forming the same. The process includes forming a first silicon structure and a second silicon structure insulated form the first silicon structure by an insulating material. The process includes forming a continuous metal layer over the structures then heating to cause the metal film to react with the silicon of each of the first and second silicon structures to form a silicide film which bridges the gap formed by the insulating material, is a substantially continuous silicide film, and electrically couples the first silicon structure to the second silicon structure. The continuous silicide film serves as a local interconnect. The structure so formed includes a contactless local interconnect formed of a continuous silicide film connecting the first silicon structure to the second silicon structure. The structure preferably includes the first silicon structure overlapping portion of the second silicon structure and having a lateral edge extending over the second silicon structure. The silicide film is a continuous film which preferably extends over the lateral edge to connect the first silicon structure to the second silicon structure. Contact openings are not required as the silicide film is a self-aligned local interconnect.

It is to be understood that both the foregoing general description and the following detailed description are exemplary, but not restrictive, of the invention.

BRIEF DESCRIPTION OF THE DRAWING

The invention is best understood from the following detailed description when read in conjunction with the accompanying drawing. It is emphasized that, according to common practice, the various features of the drawing are not to scale. On the contrary, the dimensions of the various features are arbitrarily expanded or reduced for clarity. Included in the drawing are the following figures, collectively depicting the process sequence used to fabricate the device according to the present invention.

It is to be understood that like reference numbers denote like elements throughout the figures and the text.

DETAILED DESCRIPTION OF THE INVENTION

The present invention is directed to a self-aligned and contactless local interconnect and the method for forming the same in an integrated circuit, semiconductor device. The local interconnect serves to electrically couple a plurality of silicon-containing features to one another. The silicon-containing features will have at least portions which are in close proximity but which are separated from each other by a gap filled by an insulating material. A metal film is formed over the structures, then heated. As a result of the heating, the metal in the metal film reacts to combine with the silicon in the silicon-containing structures to form silicide materials, thereby forming a substantially continuous silicide film which electrically couples the two silicon-containing features by bridging the gap formed between them by the insulating layer. The silicide film bridges the gap formed by the insulating layer because it is formed to have a grain-size greater than the thickness of the insulating layer.

Contact openings formed in subsequently formed layers, are therefore not required to connect the aforementioned silicon-containing features. Since the silicide local interconnect film is automatically formed in locations where it serves to connect the silicon-containing structures, it is a self-aligned film.

FIGS. 1A through 4B collectively depict an exemplary process sequence used to form an exemplary local interconnect according to the present invention. It should be understood that the process sequence and structures shown are intended to be exemplary, not restrictive of the present invention. For example, although the two silicon structures being interconnected are shown throughout the figures as an upper silicon structure formed overlapping a lower silicon structure and insulated from each other by a horizontal insulating film, the present invention may also be applied to silicon structures which are separated laterally from one another by an insulating material of suitably small dimension.

Figure 1B:
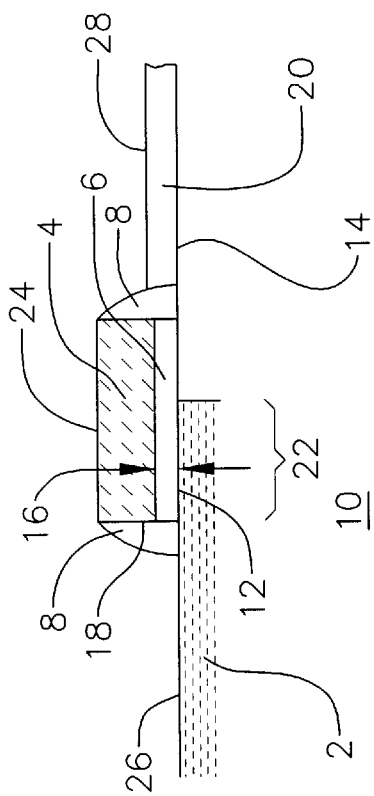
FIG. 1B is a cross-sectional view showing an upper silicon structure formed over a lower silicon structure.
Figure 1A:
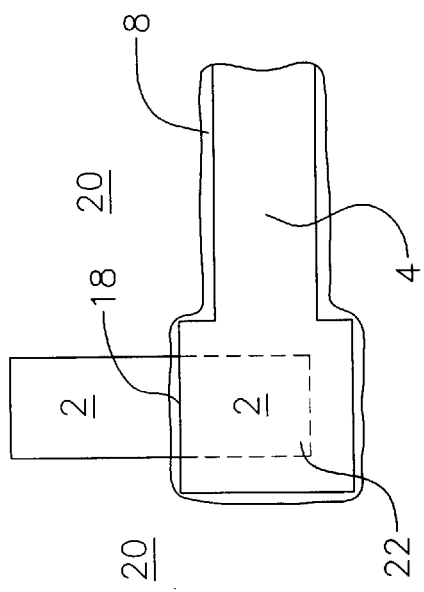
FIG. 1A is a plan view showing an upper silicon structure formed over a lower silicon structure.

Each set of figures, for example FIGS. 1A and 1B, represent a top view and a corresponding cross-sectional view of the structure at a particular step in the processing sequence.

Now turning to the figures, FIG. 1A shows a top view and FIG. 1B a cross-sectional view of the structure as in the first step of the processing sequence of the present invention. Referring to FIGS. 1A and 1B, upper silicon structure 4 is formed over lower silicon structure 2. Insulating layer 6 is interposed between lower silicon structure 2 and upper silicon structure 4. More particularly, the structure includes overlap portion 22 in which upper silicon structure 4 is formed directly over lower silicon structure 2. Each of lower silicon structure 2 and upper silicon structure 4 additionally extend laterally outside of overlap region 22. In the exemplary embodiment shown, lower silicon structure 2 may be an active area such as an electrically active impurity region formed within substrate 10. According to other exemplary embodiments, lower silicon structure 2 may be any of various other silicon structures to which electrical connection must be made by a local interconnect. For example, lower silicon structure 2 may be formed over surface 14 of substrate 10 according to various exemplary embodiments. It can be seen that lower silicon structure 2 may be considered a lower silicon layer and upper silicon structure 4 may be considered an upper silicon layer.

Substrate 10 may be formed of an insulating material according to an exemplary embodiment. Insulating layer 6 may be a gate dielectric film according to the preferred embodiment, but other insulating materials may be used alternatively. Thickness 16 of insulating layer 6 may be on the order of 1.5 to 3 nanometers according to one exemplary embodiment, and may range up to 10 nanometers according to other exemplary embodiments. Insulating layer 6 will advantageously be formed to a minimal thickness 16 which is chosen in conjunction with the materials and conditions used to form the silicide film as will be shown below.

Upper silicon structure 4 may be a segment of a silicon film such as polysilicon or amorphous silicon according to various exemplary embodiments. Upper silicon structure 4 includes top surface 24. Lower silicon structure 2 includes top surface 12 which includes exposed lower surface 26 which represents exposed regions of lower silicon structure 2 not covered by upper silicon structure 4. In an exemplary embodiment, the composite structure of upper silicon structure 4 and insulating layer 6 may be a polysilicon film formed over a gate oxide layer such as may be used in a transistor gate formed in other portions (not shown) of the integrated circuit device.

Lateral edge 18 includes portions of upper silicon structure 4 and insulating layer 6 and extends over lower silicon structure 2 representing the edge of overlap region 22. According to an exemplary embodiment, insulating spacers 8 may initially extend along the sides of upper silicon structure 4 including extending along lateral edge 18 as shown. According to other exemplary embodiments, insulating spacers 8 may not be present at this stage. Insulating spacers 8 are advantageously used in other areas of the device especially in areas where upper silicon structure 4 and insulating layer 6 combine to form a transistor gate or portion thereof. In the surrounding regions of substrate 10, a field oxide layer 20 may be formed on substrate 10 and within the substrate surface. Field oxide layer 20 includes surface 28. According to other exemplary embodiments, field oxide layer 20 may not be used and various surrounding portions of surface 14 of substrate 10 may be exposed, or they may be covered with various other insulating materials. Field oxide layer 20 is intended to be exemplary only and shallow trench isolation may be used in lieu thereof. The structures shown in FIGS. 1A and 1B are formed using conventional formation and patterning methods.

Figure 2B:
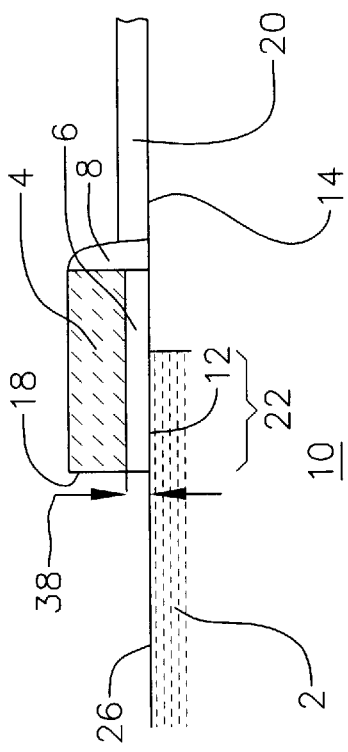
FIG. 2B is a cross-sectional view showing the structure of FIG. 1B after the lateral edge of the upper silicon structure which extends over the lower silicon structure, has been exposed.
Figure 2A:
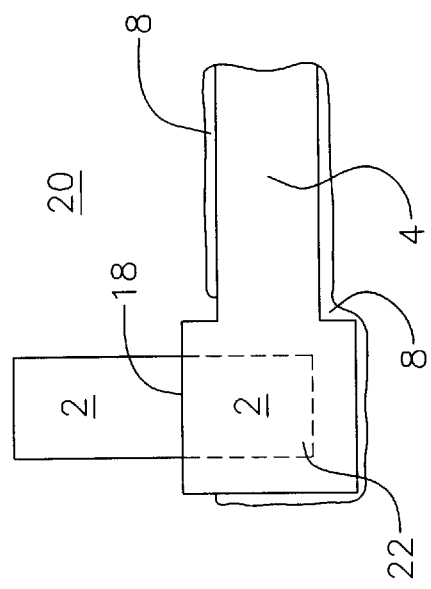
FIG. 2A is a plan view showing the structure of FIG. 1A after the lateral edge of the upper silicon structure which extends over the lower silicon structure, has been exposed.

Now turning to FIGS. 2A and 2B, insulating spacer 8 is removed at least along lateral edge 18, thereby exposing lateral portions of upper silicon structure 4 and insulating layer 6 along lateral edge 18. The removal of insulating spacer 8 along lateral edge 18 may be done using conventional etching processes. Prior to the etching processing, a conventional patterning process may take place to mask other portions of insulating spacer 8 so that portions of insulating spacer 8 remain along other portions of upper silicon structure 4 such as shown in FIGS. 2A and 2B. Gap 38 remains between upper silicon structure 4 and lower silicon structure 2. Gap 38 is filled by insulating layer 6 which electrically insulates upper silicon structure 4 from lower silicon structure 2 throughout overlap region 22 including along lateral edge 18.

Figure 3A:
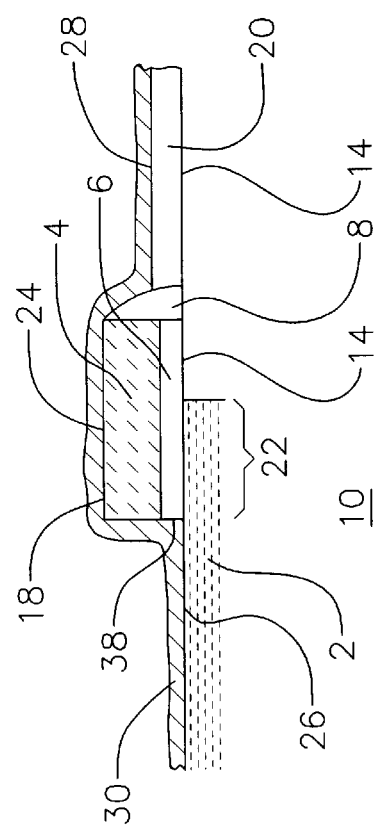
FIG. 3A is a plan view of the structure shown in FIG. 2A after a metal film has been formed over the structure.
Figure 3B:
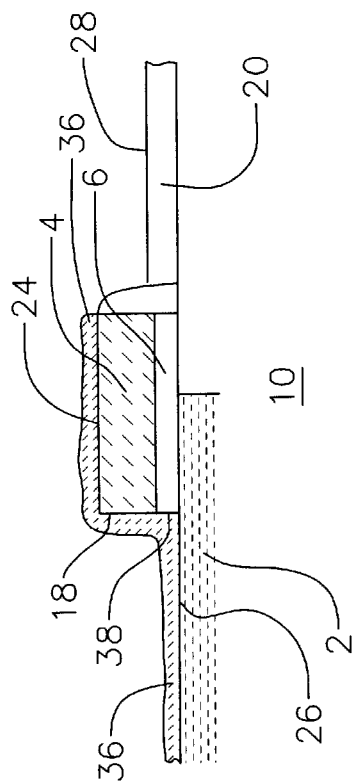
FIG. 3B is cross-sectional view showing the structure shown in FIG. 2B after a metal film has been formed over the structure.

Now turning to FIGS. 3A and 3B, a blanket metal film 30 is shown formed over the entire structure. Blanket metal film 30 may be formed using conventional means such as by PECVD (Plasma Enhanced Chemical Vapor Deposition), sputtering or evaporation. Various other film deposition methods may be used alternatively. Metal film 30 is a blanket film formed over the exposed surfaces of the substrate such as over lower exposed surface 26 of lower silicon structure 2, top surface 24 of upper silicon structure 4, insulating spacer 8, and over surface 28 of field oxide layer 20. Metal film 30 is preferably formed by a blanket deposition process. Metal film 30 may be formed of cobalt (Co), nickel (Ni), titanium (Ti), tantalum (Ta), tungsten (W), hafnium (Hf), or combinations thereof. According to another exemplary embodiment, a composite of two metal films formed of the foregoing constituents, may be used. Various thicknesses may be used and a total thickness of the film or films may vary from 20 to 50 nanometers according to exemplary embodiments. According to one particular exemplary embodiment, metal film 30 may constitute a titanium film having a thickness ranging from 10 to 16 nanometers formed over a cobalt film also having a thickness ranging from 10 to 16 nanometers. In a preferred embodiment, a 13 nanometer thick titanium film formed over a 13 nanometer thick cobalt film, may be used. After metal film 30 is blanket deposited over the structure as shown in FIGS. 3A and 3B, the metal film is caused to react with the exposed silicon surfaces. Preferably, a heating process is carried out to selectively form a silicide film in regions where metal film 30 contacts exposed silicon such as lower silicon structure 2 and upper silicon structure 4.

The structure shown in FIGS. 3A and 3B is then heated. The heating process may be carried out in a conventional furnace or it may be carried out using rapid thermal anneal (RTA). In alternative embodiments, laser annealing or other methods for causing metal to react with silicon, may be used. An exemplary heating process may be an RTA heating process at 550° C. for 30 seconds in an $N_2$ ambient. Various other RTA processes may be used alternatively. The heating process causes the metal film 30 to react with silicon in areas in which the metal film contacts silicon. Metal film 30 contacts lower silicon structure 2 on lower exposed surface 26 and metal film 30 contacts upper silicon structure 4 at top surface 24 and along lateral edge 18. In these regions of exposed silicon, the metal film reacts with the available silicon, consuming surface portions of the exposed silicon as the metal combines with the silicon to form a metal silicide film. In regions such as over insulating spacer 8 and over field oxide layer 20, in which exposed silicon is not available, the metal film is unreactive. In this manner, the silicide film formed may be considered a self aligned silicide film, referred to as salicide, because it forms preferentially only in intended areas where silicon is exposed and, in so doing, locally interconects lower silicon structure 2 to upper silicon structure 4. The formed silicide film includes a grain size being larger than thickness 16 of insulating layer 6. In an exemplary embodiment, the average grain size may be on the order of 50 nanometers for cobalt silicide.

After the heat treatment process is used to form the silicide layer, an etching process is used to remove unreacted portions of the original metal film 30. A masking pattern is not required. Various dilute acidic solutions may be used to remove the unreacted portions of the metal film without attacking the formed silicide layer. According to an exemplary embodiment in which cobalt is used as the original metal film, the following process sequence may be used to remove the unreacted cobalt film from areas such as over insulating spacer 8 and field oxide layer 20: 1:1:6 of $NH_4OH:H_2O_2:H_2O$ for three minutes, followed by 4:1 of $H_2SO_4:H_2O_2$ for three minutes. Various other chemical etching solutions may be used to remove the unreacted portions of the cobalt or other metal films.

Figure 4A:
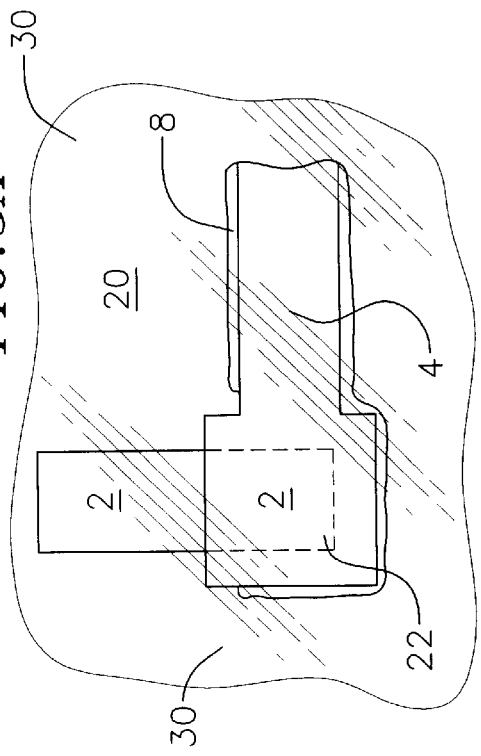
FIG. 4A is a plan view showing a silicide film formed over and connecting the lower silicon structure and the upper silicon structure.
Figure 4B:
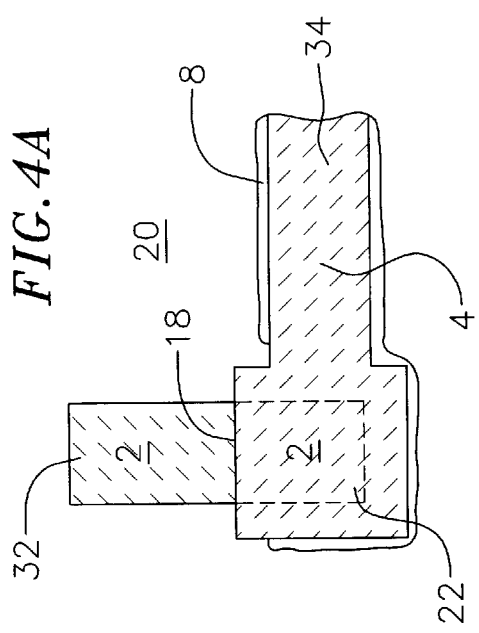
FIG. 4B is a cross-sectional view showing a silicide film formed over and connecting the lower silicon structure and the upper silicon structure.

FIGS. 4A and 4B show the structure after the heating process has been carried out to form the silicide film and also after the subsequent chemical etching process has been used to remove unreacted portions of the original metal film. Silicide film 36 is a substantially continuous silicide film including over lateral edge 18. Silicide film 36 bridges gap 38 to electrically couple upper silicon structure 4 to lower silicon structure thereby serving as a local interconnect. In areas where metal film 30 reacts with lower silicon structure 2, first silicide material 32 is formed. Similarly, in areas where metal film 30 contacts upper silicon structure 4, second silicide material 34 is formed. Thickness 16 of insulating layer 6 is chosen to be thin enough so that gap 38 is bridged by the formation of the substantially continuous silicide film 36. Preferably, silicide film 36 is formed to have a grain size larger than thickness 16 of insulating layer 6. In an exemplary embodiment the silicide film may be formed to have an average grain size on the order of 50 nanometers, but silicide film 36 may be formed to various other average grain sizes. Preferably, thickness 16 is chosen to be significantly smaller than the formed grain size enabling silicide film 36 to be continuous across gap 38. In this manner, portions of metal film 30 formed along gap 38 will more assuredly be formed into a silicide material. Stated alternatively, if gap 38 is chosen to be smaller than a grain size of the formed silicided film, then the first silicide material 32 and the upper silicide material 34 can be expected to encroach each other and fully bridge gap 38 by agglutination.

After the structure shown in FIGS. 4A and 4B is formed by heating, then chemically etching unreacted parts of the metal film, an additional heating process may be optionally carried out to reduce the contact resistivity in the silicided regions. An exemplary heating process may be carried out using an RTA process at 825° C. for 30 seconds in a nitrogen ambient, but other RTA and furnace heating processes may be used alternatively. Continuous silicide film 36 therefore serves as a self-aligned local interconnect, providing contactless electrical coupling between upper silicon structure 4 and lower silicon structure 2.

Although shown and discussed in terms of two silicon structures, it should be understood that the self aligned silicide local interconnect structure may be used to provide electrical coupling between more than two structures. For example, another upper silicon structure such as another polysilicon lead may have been formed to overlap another portion of the lower silicon structure 2 shown in FIG. 1A.

The foregoing description of the exemplary embodiments of the invention has been presented for the purpose of illustrating and describing the main points of the concepts of the invention. The present invention is not limited, however, to those embodiments. For example, more than two silicon structures may be interconnected, and the overlapping structures may be formed using different spatial arrangements. Furthermore, the lower silicon structure need not be formed in the substrate; rather, it may be a structure formed over the substrate according to alternative embodiments. Additionally, the silicon structures being interconnected by the local interconnect, may be disposed laterally with respect to one another and separated by an insulating material and by a separation distance less than the average grain size of the silicide film formed.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A method for forming a local interconnect structure in a semiconductor product, comprising the steps of:

providing a first silicon structure one of on and in a substrate and providing a second silicon structure overlapping portions of said first silicon structure, said second silicon structure insulated from said first silicon structure by an insulating layer interposed therebetween, and having a lateral edge extending over said first silicon structure;

forming a metal film over at least said first silicon structure, said second silicon structure and said lateral edge; and reacting said metal film with portions of said first and second silicon structures by heating to form a substantially continuous suicide film which electrically connects said first silicon structure to said second silicon structure, said heating urging the formation of a first silicide material on said first silicon structure and the formation of a second silicide material on said second silicon structure and urging said first silicide material to agglutinate with said second silicide material thereby forming said substantially continuous silicide film.

2. The method as in claim 1, wherein said reacting produces said substantially continuous silicide film having an average grain size being greater than a thickness of said insulating layer along said lateral edge.

3. The method as in claim 1, wherein said insulating layer includes a thickness being no greater than 10 nanometers.

4. The method as in claim 1, wherein said step of providing includes said substrate further having an additional insulating surface formed thereon;
    said step of forming said metal film includes forming said metal film over said insulating surface;
    said step of reacting causes said metal film to react with said first silicon structure to form said first silicide material and also causes said metal film to react with said second silicon structure to form said second silicide material while portions of said metal film formed over said insulating surface remain unreacted; and
    further comprising the step of removing said unreacted portions of said metal film after said step of reacting.

5. The method as in claim 4, in which said step of removing said unreacted portions of said metal film includes chemical etching in a solution including at least one of $H_2SO_4$, $H_2O_2$, and $NH_4OH$.

6. The method as in claim 1, in which said step of providing includes an insulating spacer material formed alongside said upper silicon structure including along said lateral edge and further comprising the step of removing portions of said insulating spacer from along said lateral edge prior to said step of forming a metal film.

7. The method as in claim 6, wherein said step of providing includes said substrate further having an additional insulating surface formed thereon;
    said step of forming said metal film includes forming said metal film over said additional insulating surface and over unremoved portions of said insulating spacer;
    said step of reacting causes said metal film to react with said first silicon structure to form said first silicide material and also causes said metal film to react with said second silicon structure to form said second silicide material while portions of said metal film formed over said additional insulating surface and over said unremoved portions of said insulating spacer remain unreacted; and
    further comprising the step of removing said unreacted portions of said metal film after said step of reacting.

8. The method as in claim 1, in which said second silicon structure comprises a patterned polysilicon film.

9. The method as in claim 1, in which said substrate comprises a silicon substrate and said first silicon structure comprises an active area formed within said silicon substrate.

10. The method as in claim 1, in which said step of forming a metal film includes forming a cobalt film.

11. The method as in claim 10, in which said metal film is a composite film and said step of forming a metal film includes forming a titanium film on said cobalt film.

12. The method as in claim 1, in which said step of forming a metal film includes forming a film consisting of at least one of nickel, titanium, tantalum, tungsten, and hafnium.

13. The method as in claim 1, in which said formation of said first silicide material consumes some silicon of said first silicon structure and the formation of said second silicide material consumes some silicon of said second silicon structure.

14. A semiconductor product comprising an interconnect structure including a lower silicon structure, an upper silicon structure, an insulating layer interposed therebetween, and a silicide film disposed on said lower silicon structure and said upper silicon structure and bridging a gap formed by said insulating layer between said lower silicon structure and said upper silicon structure, said silicide film including an average grain size being greater than a thickness of said insulating layer.

15. The semiconductor product as in claim 14, wherein said lower silicon structure is an active area formed within a silicon substrate, said upper silicon structure is a polysilicon film segment, and said insulating layer is an oxide layer.

16. The semiconductor product as in claim 14, wherein said silicide film includes silicon of said first silicon structure incorporated therein and silicon of said second silicon structure incorporated therein.

17. The semiconductor product as in claim 14, in which said silicide film includes at least one of Co, Ni, Ti, Ta, W, and Hf.

18. The semiconductor product as in claim 14, in which said insulating layer includes a thickness being no greater than 10 nanometers.

19. The semiconductor product as in claim 14, in which said upper silicon structure overlaps said lower silicon structure and is insulated from said lower silicon structure by said insulating layer, said upper silicon structure and said insulating layer forming a composite structure having a lateral edge extending over said lower silicon structure, and said silicide film covers said lateral edge.

20. The semiconductor product as in claim 19, further comprising an insulating spacer formed laterally along sides of said composite structure other than along said lateral edge.

21. A method for forming a local interconnect structure in a semiconductor product, comprising the steps of:
    providing a first silicon structure one of on and in a substrate and providing a second silicon structure overlapping portions of said first silicon structure, said second silicon structure insulated from said first silicon structure by an insulating layer interposed therebetween, and having a lateral edge extending over said first silicon structure;
    forming a metal film over at least said first silicon structure, said second silicon structure and said lateral edge; and
    reacting said metal film with portions of said first and second silicon structures to form a substantially continuous silicide film which electrically connects said first silicon structure to said second silicon structure.

* * * * *